United States Patent [19]
Maloberti et al.

[11] Patent Number: 5,142,236
[45] Date of Patent: Aug. 25, 1992

[54] SWITCHED-CAPACITOR CIRCUIT HAVING A FULL-WAVE-RECTIFYING AND INTEGRATING FUNCTION

[75] Inventors: Franco Maloberti, Torre D'Isola; Gino Polito, Voghera; Franco Salerno, Alpignano, all of Italy

[73] Assignee: Marelli Autronica SpA, Milan, Italy

[21] Appl. No.: 596,444

[22] Filed: Oct. 12, 1990

[30] Foreign Application Priority Data

Oct. 16, 1989 [IT] Italy ................. 67887 A/89

[51] Int. Cl.⁵ .................. H03K 5/00; H03K 5/13; H03K 5/159; H03K 3/284
[52] U.S. Cl. ........................... 328/127; 328/26; 307/494; 307/262; 307/269; 307/353; 307/272.1
[58] Field of Search .......... 307/490, 494, 262, 269, 307/272.1, 353; 328/127, 26, 128

[56] References Cited

U.S. PATENT DOCUMENTS 4,704,545 11/1987 Tanaka et al. .................. 328/127

*Primary Examiner*—Stanley D. Miller
*Assistant Examiner*—Trong Phan
*Attorney, Agent, or Firm*—Sughrue, Mion, Zinn Macpeak & Seas

[57] ABSTRACT

A switched-capacitor circuit is described, which performs the functions of a full-wave rectifier and of an integrator and has a single operational amplifier and a comparator. The circuit is insensitive to the stray capacitances and offsets of the comparator and the operational amplifier. In particular, the input signal is sampled during only one phase of the clock which pilots the operation of the switched-capacitance network.

3 Claims, 5 Drawing Sheets

SWITCHED-CAPACITOR CIRCUIT HAVING A FULL-WAVE-RECTIFYING AND INTEGRATING FUNCTION

BACKGROUND OF THE INVENTION

The present invention relates to a circuit for the (full-wave) rectification and integration of an alternating input signal, that is, a signal which can assume positive and negative amplitudes relative to a reference.

In devices for detecting alternating signals greatly affected by noise, which are generated, for example, by sensors operating in difficult environments, circuits including a full-wave rectifier and an integrator as basic components are used. A circuit of this type is used, for example, in devices for detecting pinking in Otto engines, as described, for example, in the prior patent application U.S. Ser. No. 07/592,401 filed Oct. 3, 1990 in the name of the same Applicant.

FIG. 1 of the appended drawings shows such an arrangement including a piezoelectric accelerometric sensor S whose signal is processed by a band-pass filter 1 and then by a full-wave rectifier 2 and an integrator 3 which is activated cyclically for a preset time period $T_a$. In this application, the signal $V_0$ output by the integrator 3 provides information relating to the intensity of the sensor signal in the region of the resonance frequencies typical of pinking.

A typical problem in the circuit 1 to 3 of FIG. 1 is the integration of the inevitable offset voltage affecting the input signal of the integrator and of the offset voltage generated in the integrator itself, which may lead to the saturation of the output signal. This problem leads to the need to use low-offset components or to use techniques for automatically cancelling out the offset.

With reference to the circuit of FIG. 1, this can be formed by conventional circuitry with discrete components. The following, however, is concerned with solutions which enable the circuit to be produced in integrated form, specifically by CMOS technology and particularly with the use of circuitry of the type with switched capacitors.

FIG. 2 of the appended drawings shows an embodiment of the rectifier and the integrator of FIG. 1 with switched-capacitor circuitry which can be produced in integrated form. In this embodiment, the rectifier circuit 2 has an input, indicated I, and includes a circuit 10 for determining the polarity of the input signal $V_{in}$ and an amplifier circuit, generally indicated 11.

The polarity-determining circuit 10 comprises:
a comparator CO1,
a capacitor C1 between the input terminal I and the inverting input of the comparator CO1,
first and second controlled switches S1 and S2 between earth and the plate of C1 which faces the input terminal I and between the input terminal and C1, respectively,
a third controlled switch S3 between the inverting input and the output of CO1,
a controlled switch S10 between the output of CO1 and the input of a flip-flop circuit, generally indicated 12, whose outputs are indicated A and $\bar{A}$.

In operation, the switches S1, S3 and S2, S10 respectively are piloted in an on-off manner by two clock signals, indicated, $\phi_1$ and $\phi_2$, which have the same frequency but are out of phase so that their respective active periods ("on" times, that is, the periods when the associated switches are closed) alternate and do not overlap, as shown by the corresponding waveforms shown in FIG. 3. As experts in the art can immediately confirm, if the input signal $V_{in}$ is of positive (negative) polarity, the output A of the flip-flop 12 is at level "1" ("0").

The amplifier circuit 11 comprises:
an operational amplifier A1 with its non-inverting input connected to earth,
a capacitor C2 between the input terminal I and the inverting input of A1,
a capacitor C3 between the inverting input and the output of A1,
two controlled switches S4, S5 connected to C2,
two further controlled switches S6 and S8 arranged between the input I and S4 and between I and S5, respectively,
two further controlled switches S7 and S9 connected between earth and the connection between S4 and S6 and between earth and the connection between S5 and S8, respectively,
two further controlled switches S12 and S13 in series and in parallel with C3 respectively, and
a further controlled switch S11 between earth and the connection between C3 and S12.

In operation, S4 and S12 are piloted by the clock or phase signal $\phi_1$, whilst S5, S11 and S13 are piloted by the phase signal $\phi_2$. S7 and S8 are piloted by the output A of the flip-flop 12, whilst S6 and S9 are piloted by the output $\bar{A}$ of the flip-flop.

When the input signal $V_{in}$ is of positive polarity, the outputs A and $\bar{A}$ of the flip-flop 12 control the switches S6, S7, S8 and S9 so that the operational amplifier A1 is connected as a non-inverting amplifier: during each "on" period of the phase signal $\phi_2$, the capacitor C2 samples the signal $V_{in}$ whilst, during each of next "on" period of $\phi_1$, it outputs its charge. When the signal $V_{in}$ is of negative polarity, the switches S6, S7, S8 and S9 are controlled so that the operational amplifier A1 constitutes an inverting amplifier: in this case, the capacitor C2 samples the signal $V_{in}$ and outputs its own charge during each "on" period of the phase $\phi_1$.

The integrator 3 comprises:
an operational amplifier A2 with its non-inverting input connected to earth,
two capacitors C4, C5 connected between the inverting input of A2 and the output of A1 and between the inverting input and the output of A2, respectively,
two controlled switches S16 and S19 in series with C5,
two further controlled switches S17 and S18 in parallel between the output and the inverting input of A2, and
two further controlled switches S14 and S15 between the output of A1 and C4 and between earth and the connection between S14 and C4, respectively.

In operation, S14 and S17 are piloted by the phase signal $\phi_1$, whilst S15 and S16 are piloted by the phase signal $\phi_2$. S18 and S20 are piloted by a signal R which is normally at level "one" and is at low level during the time period $T_a$ corresponding to the period during which the integrator 3 is required to integrate. This signal, like the phase signals $\phi_1$ and $\phi_2$, is generated by a control circuit, generally indicated CU in FIG. 2, the details of which, however, are not essential for the purposes of the present description.

An example of the waveform of R is shown in FIG. 3.

The switch S19 of the integrator 3, however, is piloted by a signal $\overline{R}$ complementary to R.

As has been seen above, in operation, the rectifier 2 outputs its signal during each "on" period of $Q_1$: during each of these periods, the integrator 3 zeroes its own offset voltage by means of S17 which puts A2 into the voltage-follower configuration. During each "on" period of $\phi_1$, the integrator 3 samples the voltage output by the rectifier 2, by means of the capacitor C4. The capacitor C5 acts as the integrating and memory element. It is discharged only at the end of the integration period $T_a$ by means of the switches S18, S19, S20 which are controlled by the signals R (reset) and R (integration signal).

Obviously, the switches S19 and S16 can be replaced by a single switch controlled by the conjunction (AND) of the signals $\overline{R}$ and $\phi_2$.

The offset voltage of A1 is cancelled out during the "on" times of $Q_2$ by the discharge of the capacitor C3 and the connection of A1 in the "voltage-follower" configuration by means of S13.

The solution described above with reference to FIG. 2 requires a large number of components.

A first considerable simplification of the circuit is possible by incorporating the rectifier and integrator functions in the same circuit, thus eliminating an operational amplifier, as shown in FIG. 4. In this drawing, in which components described above have again been given the same reference symbols, it can be seen that the circuit 10, 12 for determining the polarity of the input signal $V_{in}$ remains unchanged. The full-wave rectification and the integration of the input signal, on the other hand, are achieved with the use of a single operational amplifier A1 with its associated capacitors and controlled switches. The clock signals $\phi_1$ and $\phi_2$, as well as the integration control signal R, retain the same waveforms, shown by way of example in FIG. 3.

The capacitor C3 acts as an integrating and memory element which is zeroed at the end of the integration period $T_a$ by means of the switches S19 and S20 piloted by the signals $\overline{R}$ and R.

The rectified and integrated signal is available at the output of the amplifier A1.

The circuit according to FIG. 4 has a much simplified structure but also has a disadvantage. In effect, the input signal $V_{in}$ is sampled during the "on" periods of the phase signal $\phi_1$ or $\phi_2$ in dependence on its polarity. This presupposes that the signal $V_{in}$ is always available in both the phases $\phi_1$ and $\phi_2$. In some applications, a useful signal is not always available throughout the clock period of the switched-capacitor system. It is thus convenient always to be able to sample the input signal in the same phase, regardless of its polarity. This would also enable the cancellation, during the other phase, of any offset voltages in the circuit upstream which generates the signal $V_{in}$. This function is particularly important when signals must be integrated over long periods of time. In fact, in such cases, the minimising of the offset voltages of the input signal and of the components for processing it (amplifiers, comparators, etc.) becomes one of the main objectives for ensuring the correct operation of the device.

SUMMARY OF THE INVENTION

The object of the present invention, therefore, is to provide a new circuit in which the full-wave rectification and integration of the input signal are achieved by a single operational amplifier and in which the input signal is always sampled during the same phase, regardless of its polarity. This object is achieved, according to the invention, by means of a circuit whose characteristics are defined in the appended claims.

As will become clearer from the following, the circuit according to the invention is insensitive to the stray capacitances and offsets of its active components (the comparator and operational amplifier). The input signal is sampled during only one phase of the clock which regulates the operation of the switched-capacitor circuit.

BRIEF DESCRIPTION OF THE DRAWINGS

Further characteristics and advantages of the invention will become clear from the detailed description which follows with reference to the appended drawings, in which.

DETAILED DESCRIPTION OF THE INVENTION

Figure 5:
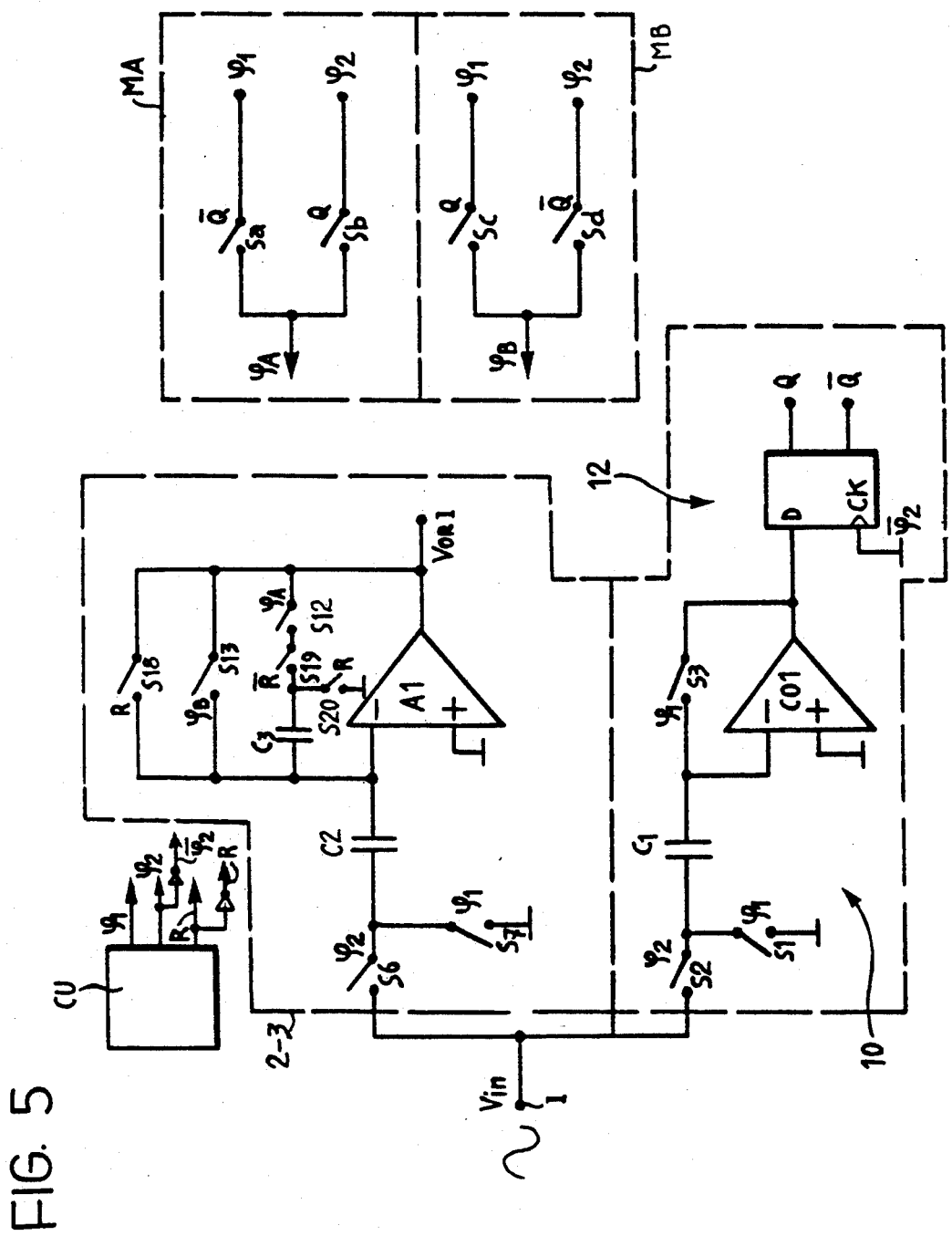
FIG. 5 shows a detailed circuit diagram of a rectifier-integrator circuit according to the invention.

With reference to FIG. 5, in the circuit according to the invention, the circuit for determining the polarity of the input signal comprises a comparator circuit 10 identical to that described above, connected to a flip-flop circuit 12 which is preferably of the D type. The clock input of the flip-flop is piloted by the signal $\overline{\phi_2}$ which is complementary to the phase signal $\phi_2$. The outputs of the flip-flop 12 are indicated Q and $\overline{Q}$.

The circuit of FIG. 5 includes two multiplexers MA and MB each having two inputs for receiving the clock signals $\phi_1$ and $\phi_2$ respectively, and an output.

With reference to MA, two controlled switches $S_a$ and $S_b$ are provided between its $\phi_1$ and $\phi_2$ inputs and its output and are piloted by the outputs $\overline{Q}$ and Q of the flip-flop 12.

Similarly, two controlled switches $S_c$ and $S_d$ are provided between the $\phi_1$ and $\phi_2$ inputs and the output of MB and are piloted by Q and $\overline{Q}$ respectively.

Figure 6:
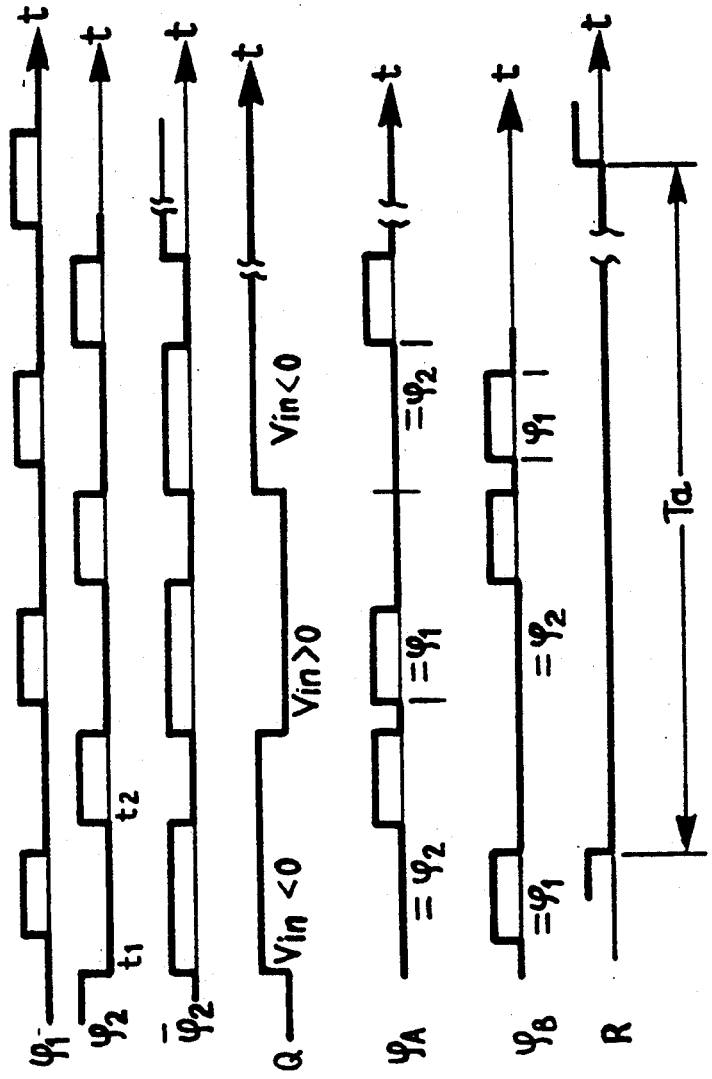
FIG. 6 is a series of graphs showing the waveforms of some control signals used for piloting the circuit illustrated in FIG. 5.

If $\phi_1$ and $\phi_2$ have the waveforms shown in FIG. 6, two signals, indicated $\phi_A$ and $\phi_B$, whose waveform depends on the polarity of the input signal $V_{in}$, are available at the outputs of MA and MB.

In effect, if $V_{in}$ is positive, Q is at level "0" and hence $\phi_A$ is equal to $\phi_1$ whilst $\phi_B$ is equal to $\phi_2$. If $V_{in}$ is negative, however, Q is at level "1" and hence $\phi_A$ is equal to $\phi_2$ and $\phi_B$ is equal to $\phi_1$, as shown in FIG. 6.

Figure 1:
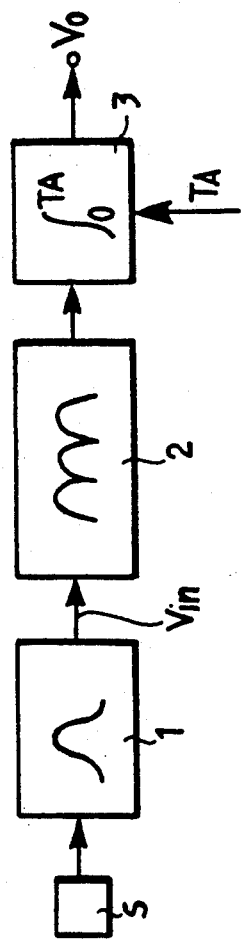
FIG. 1, directed to a conventional circuit, shows a circuit for processing the signal supplied by a sensor.
Figure 3:
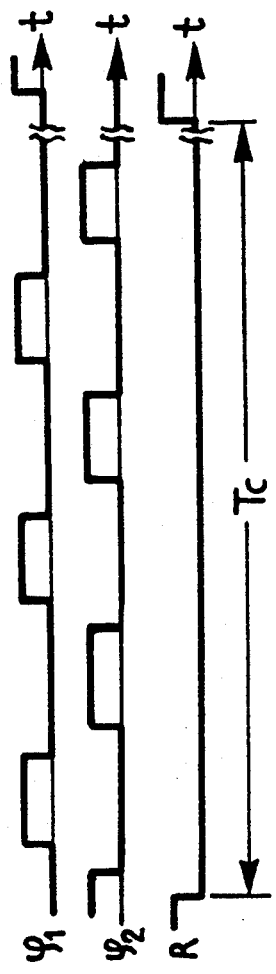
FIG. 3, is a series of graphs showing the waveforms of some signals used for controlling the circuits shown in FIG. 2, FIG. 4, shows a variant of the circuitry shown in FIG. 2.
Figure 2:
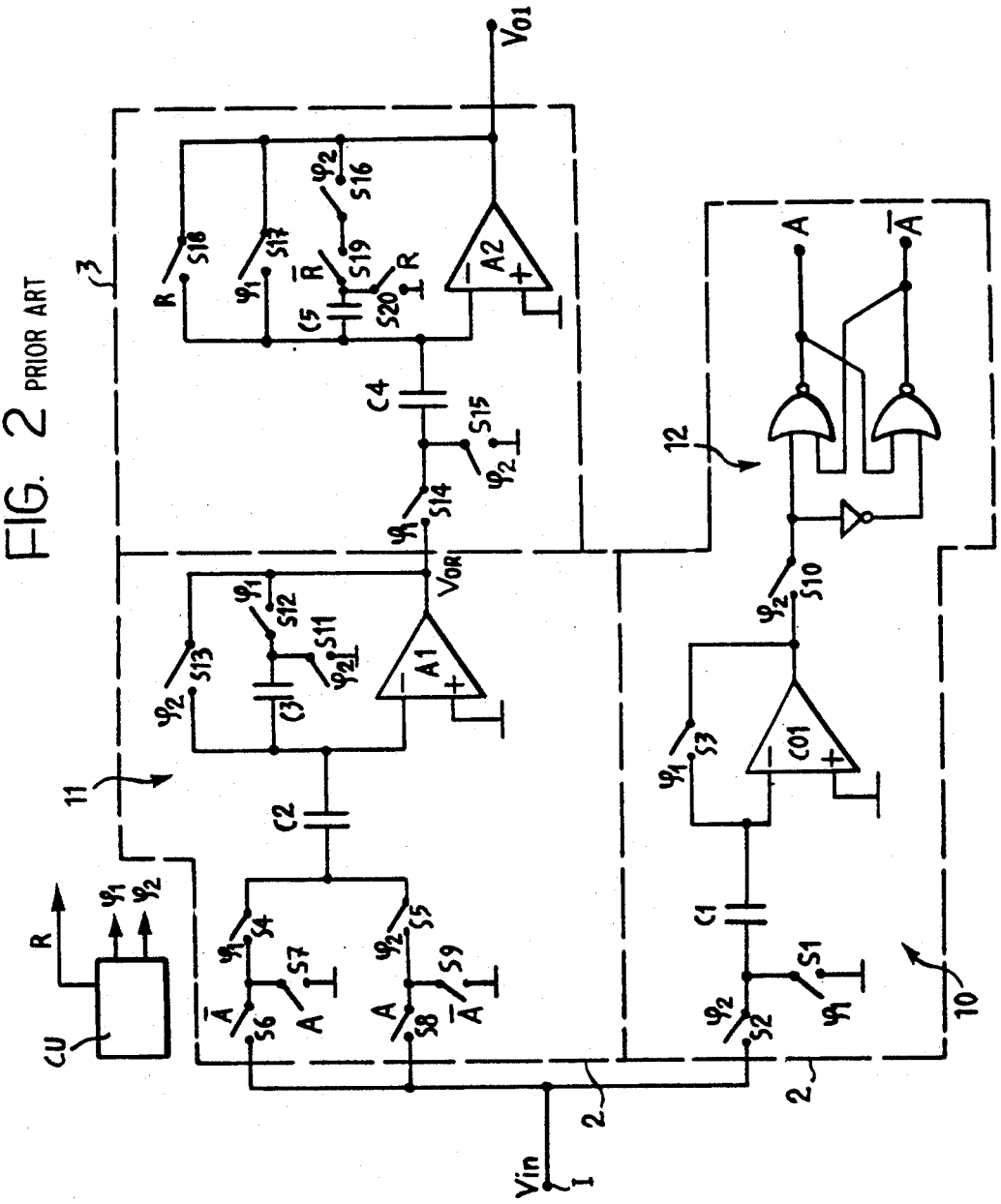
FIG. 2, is a detailed circuit diagram of a prior embodiment of a rectifier and an integrator with switched-capacitor circuitry.
Figure 4:
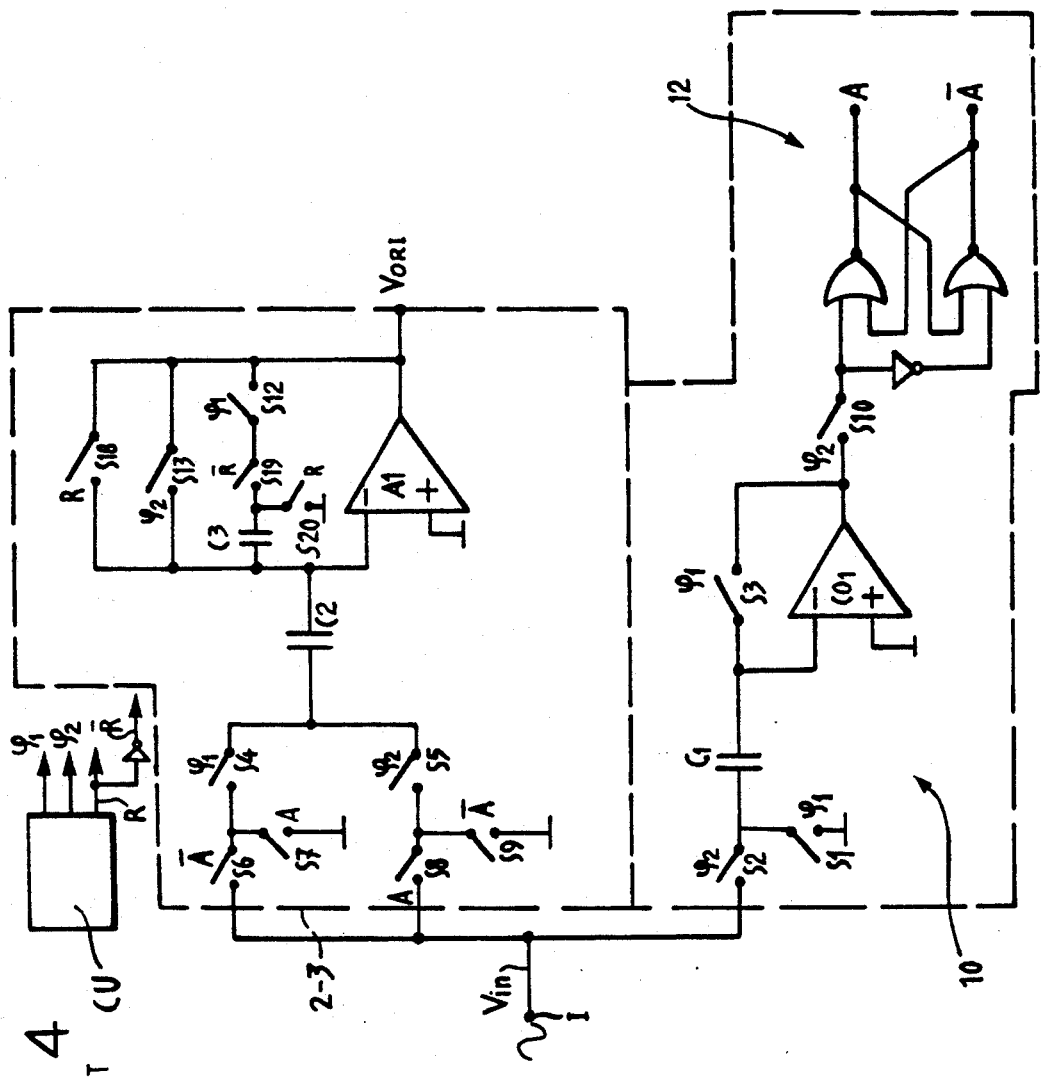

With reference to the diagram of FIG. 5, the rectifier-integrator circuit 2-3 includes a single operational amplifier A1 with associated capacitors C2 and C3 and controlled switches S12, S13, S18, S19 and S20, arranged as in the diagram of FIG. 4. it will be noted that in the diagram of FIG. 5, however, the switches S12 and S13 are piloted by the signals output by the multiplexers MA and MB.

The circuit according to FIG. 5 operates as follows.

During an integration phase $T_a$, R is at level "1", S19 is closed, and S20 and S18 are open. The input signal $V_{in}$ is sampled during the "on" times of the phase signal $\phi_2$ and, in the same time periods, the comparator circuit 10 determines the polarity of the input signal. The signal output by the comparator circuit 10 appears on the line Q of the flip-flop 12 at the end of each "on" time of the phase signal $\phi_2$ (the leading edge of $\overline{\phi}_2$) and is stored for a period.

If the input signal $V_{in}$ is of positive polarity, the multiplexers MA and MB cause the phase $\phi_A$ to coincide with the phase $\phi_1$ and the phase $\phi_B$ to coincide with the phase $\phi_2$. The rectifier-integrator circuit therefore assumes a configuraton such that the input signal $V_{in}$ is integrated by means of the integration capacitor C3 in non-inverting mode during the phase $\phi_1$.

If the signal $V_{in}$ is of negative polarity, on the other hand, the multiplexers MA and MB cause the phase $\phi_A$ to coincide with the phase $\phi_2$ and the phase $\phi_B$ to coincide with the phase $\phi_1$. In this case, the capacitor C2 samples and transfers its charge to the capacitor C3 during the phase $\phi_2$ and the latter integrates the signal in inverting mode.

The signal output by the rectifier-integrator circuit is available at the output of A1 during the phase $\phi_A$.

The integration capacitor C3 is discharged during the phases in which integration is not being carried out, that is, outside the time window $T_a$ or rather when the signal R is at level "1" (S18 and S20 closed, S19 open). This capacitor is thus discharged at the input voltage of the operational amplifier A1 which is equal to the offset of that operational amplifier. The offset is thus automatically cancelled out, eliminating any chance of errors in the next integration phase.

The use of a D-type flip-flop synchronised with the phase $\overline{\phi}_2$ prevents inaccuracies in the levels of the signals output by the multiplexers MA and MB which could destroy the voltage stored in the integration capacitor C3. In fact, because the active periods ("on" times) of the clock signals $\phi_1$ and $\phi_2$ do not overlap, signals are transferred to the outputs of MA and MB in time periods during which $\phi_1$ and $\phi_2$ are both at low level, that is, between a trailing edge of $\phi_2$ and the next leading edge of $\phi_1$.

The switched-capacitor circuit of FIG. 5 performs the full-wave rectification and integration functions by means of a single operational amplifier which effects an inverting or non-inverting integration according to the polarity of the input signal. In particular, the input signal is sampled in only one phase, enabling the cancellation in the other phase of the offset in the circuits upstream which output the signal $V_{in}$ to be rectified and integrated.

What is claimed is:

1. A circuit for rectifying and integrating an alternating input signal, comprising:
   an input terminal,
   an operational amplifier,
   a first capacitor between the input terminal and the inverting input of the amplifier and a second capacitor between the inverting input and the output of the amplifier,
   first and second controlled switches connected between earth and the plate of the first capacitor which faces the input terminal and between the input terminal and the first capacitor, respectively,
   third and fourth controlled switches connected in series and in parallel with the second capacitor, respectively,
   a clock-signal generator for supplying to the first and second switches respectively first and second clock signals which have the same frequency but which are out of phase so that the respective periods, during which the corresponding switches are closed, alternate and do not overlap, and
   control circuit means adapted to supply to the third and fourth switches respective first and second piloting signals which correspond to the first and second clock signals respectively when the input signal has one polarity, but which correspond to the second and first clock signals respectively when the input signal has the opposite polarity,
   wherein the control circuit means comprise:
   a polarity-determining circuit for providing a logic signal indicative of the polarity of the input signal;
   multiplexing circuit means connected to the clock-signal generator means and controlled by the polarity-determining circuit; and
   wherein the polarity-determining circuit comprises:
   a comparator circuit with an inverting input and a non-inverting input,
   a capacitor connected between the input terminal and the inverting input of the comparator circuit,
   first and second switches controlled by means of the first and second clock signals respectively and arranged between earth and the plate of the capacitor which faces the input terminal and between the input terminal and the capacitor respectively, and an additional switch piloted by the first clock signal and connected between the inverting input and the output of the comparator circuit.

2. A circuit according to claim 1, wherein the output of the comparator circuit is connected to a D-type flip-flop having a clock input and circuit means connected to the clock input to supply a signal complementary to the second clock signal.

3. A circuit for rectifying and integrating an alternating input signal, comprising:
   an input terminal,
   an operational amplifier,
   a first capacitor between the input terminal and the inverting input of the amplifier and a second capacitor between the inverting input and the output of the amplifier,
   first and second controlled switches connected between earth and the plate of the first capacitor which faces the input terminal and between the input terminal and the first capacitor, respectively,
   third and fourth controlled switches connected in series and in parallel with the second capacitor, respectively,
   fifth and sixth controlled switched connected in parallel and in series with the second capacitor respectively,
   a seventh controlled switch connected between the second capacitor and earth;
   the fifth and seventh switches being intended to be piloted so as to be open for each time period in which the input signal is integrated, while the sixth switch is intended to be piloted in a complementary manner, a clock-signal generator for supplying to the first and second switches respectively first and second clock signals which have the same frequency but which are out of phase so that the respective periods, during which the corresponding switches are closed, alternate and do not overlap, and control circuit means adapted to supply to the third and fourth switches respective first and second piloting signals which correspond to the first and second clock signals respectively when the input signal has one polarity, but which correspond to the second and first clock signals respectively when the input signal has the opposite polarity.

* * * * *